United States Patent [19]
Knutson et al.

[11] Patent Number: 5,282,154
[45] Date of Patent: Jan. 25, 1994

[54] SYSTEM FOR DETERMINING AND REPAIRING INSTABILITY IN AN IIR FILTER SUITABLE FOR USE IN DEGHOSTING APPARATUS

[75] Inventors: Paul G. Knutson; David L. McNeely, both of Indianapolis, Ind.

[73] Assignee: Thomson Consumer Electronics, Inc., Indianapolis, Ind.

[21] Appl. No.: 891,582

[22] Filed: Jun. 1, 1992

[51] Int. Cl.$^5$ .................................. G06F 15/31
[52] U.S. Cl. ..................... 364/724.16; 364/724.03
[58] Field of Search ............ 364/724.16, 724.17, 364/724.03, 724.01

[56] References Cited

U.S. PATENT DOCUMENTS

| | | | |
|---|---|---|---|
| 5,050,119 | 9/1991 | Lish | 364/724.16 |
| 5,051,942 | 9/1991 | Matsumoto et al. | 364/724.01 |
| 5,058,047 | 10/1991 | Chung | 364/724.16 |
| 5,065,242 | 11/1991 | Dieterich et al. | 358/167 |
| 5,148,382 | 9/1992 | Kishi | 364/724.03 |
| 5,157,622 | 10/1992 | Makino et al. | 364/724.16 |

*Primary Examiner*—David H. Malzahn
*Attorney, Agent, or Firm*—Joseph S. Tripoli; Eric P. Herrmann; Ronald H. Kurdyla

[57] ABSTRACT

A digital transversal IIR filter, in which the sum of the magnitudes of a large number of coefficient multipliers (which may be real or complex) is greater than unity, may be stable or it may be unstable. The present invention is directed to (1) a test for stability in such a filter which is simpler and faster than solving a large number of polynomial equations, and (2) the repair of a filter found by this test to be unstable. Specifically, means responsive to the respective gradients of the magnitudes of chirp-z transforms of time-domain multiplier coefficient values within one or more selected localized regions of the complex in-phase (I), quadrature(Q) frequency-domain plane determine that a filter is unstable whenever the gradient of the magnitude values of the chirp-z transform within a selected localized region of the frequency-domain plane indicates that there is a pole in the frequency-domain plane that is located beyond the boundary of a frequency-domain unit circle. The selected localized region may consist of sample points situated on the respective circumferences of a unit circle, a slightly smaller circle inside the unit circle and a slightly larger circle outside the unit circle in the frequency domain plane. Repair of an unstable filter may be accomplished by deriving different non-zero valued multiplier coefficients by flattening the phase response within the selected localized region of the frequency domain before converting back to the time domain.

11 Claims, 5 Drawing Sheets

SYSTEM FOR DETERMINING AND REPAIRING INSTABILITY IN AN IIR FILTER SUITABLE FOR USE IN DEGHOSTING APPARATUS

BACKGROUND OF THE INVENTION

1. Field of the Invention

This invention relates to a system for determining whether an IIR (infinite impulse response) digital filter, in which the sum of the magnitudes of its filter coefficients is more than unity, is unstable and, if so, flattening the phase response of the filter to render it stable. This system is particularly applicable to stabilizing the IIR digital filter of deghosting apparatus employed in a digitally-implemented television receiver for reducing multipath signal components of a received transmitted television signal.

2. Description of the Prior Art

Known in the art is so-called deghosting apparatus, which is situated in a television receiver at a given location for eliminating or, at least, substantially reducing multipath distortion from a video signal derived from a broadcast television channel received thereby. One example of such deghosting apparatus, which is implemented in digital form, is disclosed in U.S. Pat. No. 5,065,242, which issued to Dieterich et al. on Nov. 11, 1991, the teachings of which are incorporated herein by reference. This type of deghosting apparatus has been proposed for use by either a standard (NTSC) or a high-definition (HDTV) digital television receiver responsive to the appropriate one of simulcast NTSC or HDTV television signals received thereby.

Specifically, the deghosting apparatus disclosed in U.S. Pat. No. 5,065,242 incorporates a training signal which is a finite duration sequence of repetitions of a $2^n-1$ pseudorandom sequence. The $2^n-1$ pseudorandom sequences are mapped into $2^r$ sample intervals at either the transmitter or the receiver to facilitate fast Fourier transform processing. Power spectra of the received and mapped training signal and a stored version of the training signal are deconvolved with the deconvolution coefficients produced in logarithmic form. The logarithms are inverse Fourier transformed to produce delay coefficients related to the time of occurrence of the multipath signals, which coefficients are utilized to program variable delay circuitry in an adaptive filter to cancel the multipath components. Such programming is required because the multipath components depend on the particular location of each individual digital television receiver.

This adaptive filter includes an IIR digital transversal filter, which may comprise a tapped delay line implemented by a relatively large shift register (e. g., a 256 or 512 stage shift register), with only a relatively small number of these stages (e. g. 25 to 127 stages) having non-zero real or complex multiplier coefficients associated with the taps thereof. However, the particular ones of the stages of the shift register having non-zero multiplier coefficients, as well as the quantized value of each of them, are programmable in order to provide the maximum cancellation of the multipath components received by that particular digital television receiver, without causing the IIR filter itself to become unstable (due to excessive positive feedback).

It is known that an IIR filter will always be stable so long as the sum of the magnitudes of each of its multiplier coefficients is less than unity. Should the sum of the magnitudes of each of the IIR filter's multiplier coefficients be greater than unity, it may or may not be stable in any given case. Thus, in order to insure IIR filter stability in all cases, it has been the practice in the past to scale the value of each of the multiplier coefficient magnitudes by the same fractional value (thereby not changing their relative values) whenever the sum of their unscaled values exceeds unity, so that the sum of the magnitudes is below unity. However, such scaling reduces the degree to which the deghosting apparatus is capable of cancelling the multipath distortion.

The teachings of the present invention makes it possible in nearly all cases to employ a sum of the magnitudes of the IIR filter multiplier coefficients greater than unity without the possibility of the IIR digital filter becoming unstable. When the teachings of the present invention are applied to deghosting apparatus, the degree of cancellation of multipath distortion is maximized. However, the benefits of the teachings of the present invention are applicable to the design of any IIR digital filter, regardless of its particular use.

SUMMARY OF THE INVENTION

The present invention is directed to an improvement in a system incorporating an IIR digital transversal filter that includes a delay line having N taps, where N is a given plural integer and particular non-zero valued multiplier coefficients are associated with only certain ones of the N taps and zero-valued coefficients are associated with remaining ones of the taps. This improvement comprises means responsive to the respective gradients of the magnitudes of the chirp-z transforms of the time-domain multiplier coefficient values within one or more selected localized regions of the complex in-phase (I), quadrature(Q) frequency-domain plane to determine whether or not the IIR filter is stable when the sum of said magnitudes in the time domain is greater than unity. A determination of filter instability is made whenever the gradient of the magnitude values of the chirp-z transform within a selected localized region of the frequency-domain plane indicates that there is a pole in the frequency-domain plane that is located beyond the boundary of a frequency-domain unit circle.

Repair of an unstable filter may be accomplished by deriving different non-zero valued multiplier coefficients by flattening the phase response within the selected localized region of the frequency domain before converting back to the time domain.

DESCRIPTION OF THE PREFERRED EMBODIMENTS

It is known that a digital television receiver includes a computer processing unit (CPU) and a stored program for controlling the operation thereof. Among other things, the CPU and stored program, together with a received training signal, may be used to automatically define the frequency-response characteristics of an IIR digital deghosting filter employed by the receiver for the purpose of cancelling multipath components included in the received television-channel signal.

Figure 1:
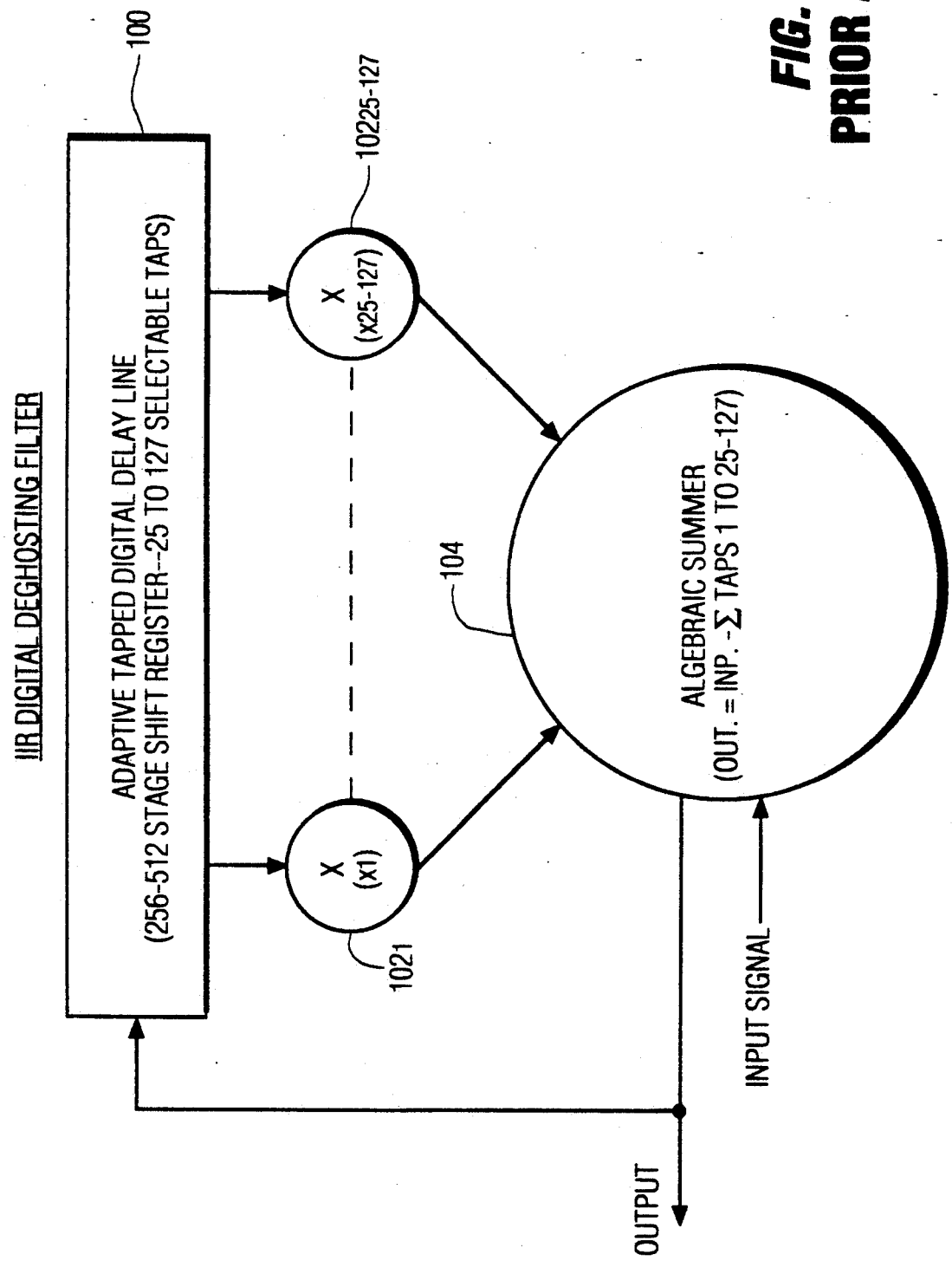
FIG. 1 is a block diagram of an IIR digital transversal filter of the type that may be employed in deghosting apparatus of a digital television receiver.

Such an IIR digital deghosting filter, known in the prior art and shown in FIG. 1, comprises an adaptive tapped digital delay line 100, a plurality of between 25 and 127 individual non-zero coefficient multipliers $102_1$ to $102_{25-127}$, and an algebraic summer 104. Adaptive tapped digital delay line 100 comprises a shift register having a large number of stages (e.g. 256 or 512 stages). While the plurality of individual non-zero coefficient multipliers are shown in FIG. 1 as being anywhere between 25 and 127, a typical 512-tap digital delay line 100 employed in the deghosting apparatus of a digital television receiver, in practice, has a number of individual non-zero coefficient multipliers that is usually in the neighborhood of only 60. Each of the shift-register stages has its own individual tap which may either comprise a zero-value coefficient tap or, alternatively, a non-zero-value coefficient tap by being selectively coupled to one of multipliers $102_1$ to $102_{25-127}$. The frequency-response characteristic of the IIR digital deghosting filter is defined in accordance with both the respective values of the non-zero coefficients $x_1$ to $x_{25-127}$ of multipliers $102_1$ to $102_{25-127}$ and that selected set of shift-register-stage taps to which multipliers $102_1$ to $102_{25-127}$ are connected. Further, programming is provided for selecting a set of taps and choosing the particular value of all the non-zero coefficients $x_1$ to $x_{25-127}$ of the multipliers $102_1$ to $102_{25-127}$ to derive a desired frequency-response characteristic for cancelling multipath components. Although the values of all of these coefficients $x_1$ to $x_{25-127}$ may be confined solely to real (i.e., inphase (I)) values, coefficients $x_1$ to $x_{25-127}$ preferably have both real and imaginary (i.e., quadrature-phase (Q)) values. The input signal to the IIR filter, together with the output of all the multipliers, are applied as inputs to algebraic summer 104. The output from algebraic summer 104, which constitutes the output signal from the IIR filter, is also fed back as an input to the shift register comprising adaptive tapped digital delay line 100.

As indicated in FIG. 1, the value of the output signal from algebraic summer 104 is equal to the difference in value between the real or complex input signal and the sum of the real or complex values of coefficients $x_1$ to $x_{25-127}$. This may result in the real-value component of this difference having a negative value sufficient to cause the IIR filter to be unstable. Known in the art is the so-called Chao test, which states that if the sum of the magnitudes of all the coefficients of a digital IIR filter is less than unity, the filter is inherently stable. However, if the sum of the magnitudes of all the coefficients of a digital IIR filter is greater than unity, the filter may or may not be stable. In order to determine whether or not a digital IIR filter in which the sum of the magnitudes of all the coefficients is greater than unity is stable, it has been necessary in the past to solve a set of polynomial equations including all the coefficients (including zero-valued coefficients) from all the shift-register taps of the filter. In the case of an IIR deghosting filter comprising 256 or 512 taps, the computations required to solve this set of polynomial equations in a digital television receiver make this approach impractical. For this reason, the approach employed by the prior art is to scale back the value of each coefficient by that same given fraction required to pass the Chao test. The price to be paid for this latter approach is to reduce by a proportionate amount the ability of an IIR digital deghosting filter to cancel multipath components.

The present invention is directed to a new approach, which does not require excessive computation, for determining whether or not a digital IIR filter in which the sum of the magnitudes of all the coefficients is greater than unity is stable, and, if it is unstable, in most cases making it stable. Thus, with this new approach it is possible to employ coefficient values in which the sum of the magnitudes of all the coefficients is greater than unity, and thereby maximize the ability of an IIR digital deghosting filter to cancel multipath components.

One type of transform, known in the art, for converting time-domain sampled data into frequency-domain sampled data is a discrete Fourier transform (DFT), which is usually implemented by a fast Fourier transform (FFT) algorithm. Equation 1, set forth below, is directed to the relationship of each frequency-domain sample point in the complex I,Q plane as a function of time-domain sample points in accordance with FFT. Another type of transform, known in the art, for converting time-domain sampled data into frequency-domain sampled data is a chirp-z transform. Equation 2, set forth below, is directed to the relationship of each frequency-domain sample point in the complex I,Q plane as a function of time-domain sample points in accordance with a chirp-z transform.

$$F_{FFT_k} = \frac{1}{\sum_{n=0}^{N-1} x_n e^{\frac{-j2\pi kn}{N}}} \qquad (1)$$

and $$F_{cz_k} = \frac{1}{\sum_{n=0}^{N-1} x_n r^n e^{\frac{-j2\pi kn}{N}}} ; \qquad (2)$$

where k is the location in the frequency-domain complex I,Q plane of a polar-coordinate-vector sample point having a selected magnitude and phase, $F_{FFT_k}$ is the magnitude value of the FFT at location k in the frequency-domain complex I,Q plane, $F_{CZ_k}$ is the magnitude value of the chirp-z transform at location k in the frequency-domain complex I,Q plane, n is the ordinal number of any one of N time-domain sample points having either zero or non-zero values, $x_n$ is the value of the nth time-domain sample point, and r is the magnitude of the polar-coordinate vector sample point at location k in the frequency-domain complex I,Q plane.

By comparing equation 2 to equation 1, it is seen that equation 2 differs from equation 1 only in the substitution of the expression $x_n r^n$ in equation 2 for $x_n$ in equation 1. Thus, in the special case in which the value of r happens to be unity, the chirp-z transform of equation 2 and the FFT transform of equation 1 become identical to one another, so that the FFT transform is the chirp-z transform for any sample point on a unit circle. The principles of the present invention, exemplified in FIG. 2, make use of this fact.

Figure 2:
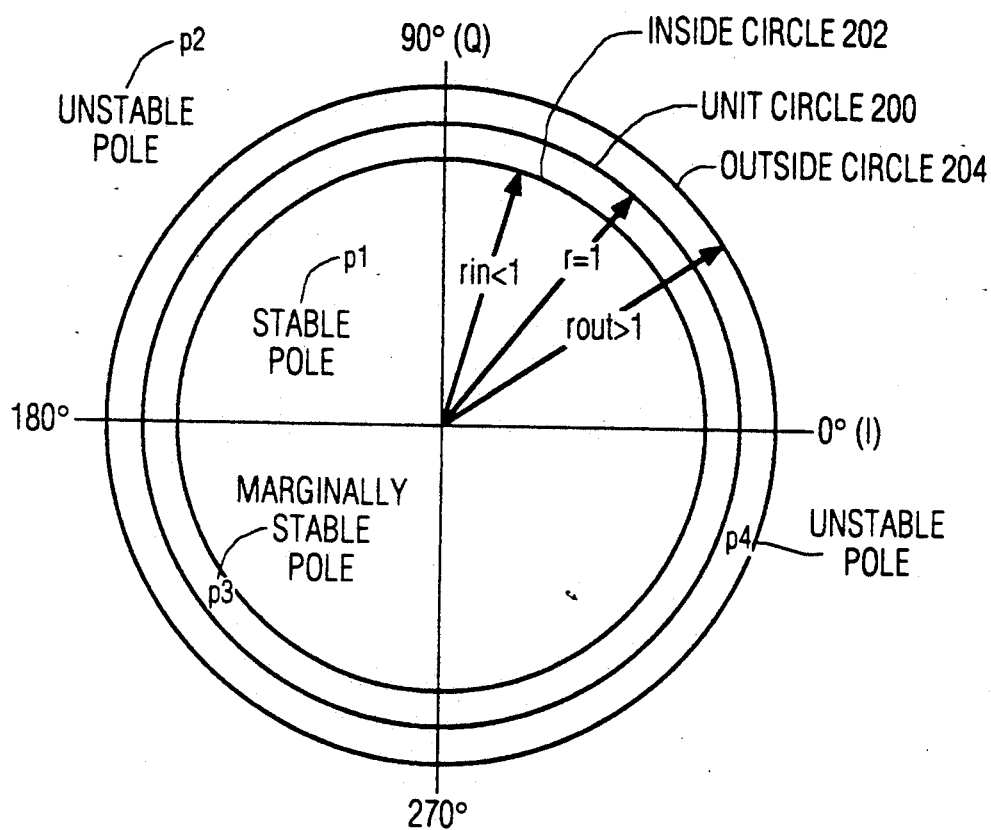
FIG. 2 is a frequency-domain diagram in the complex I,Q plane of a unit circle, a circle inside the unit circle and a circle outside the unit circle, useful in explaining the principles of the present invention.

Referring to FIG. 2, there is shown unit circle 200, a slightly smaller inside circle 202 and a slightly larger outside circle 204, all situated in the frequency-domain complex plane, thereby defining an inner annulus between unit circle 200 and inside circle 202 and an outer annulus between unit circle 200 and outside circle 204. Unit circle 200 is the locus of polar-coordinate vector points at all phases having a magnitude equal to unity ($r=1$); inside circle 202 is the locus of polar-coordinate vector points at all phases having a magnitude less than unity ($rin<1$); and outside circle 204 is the locus of polar-coordinate vector points at all phases having a magnitude greater than unity ($rout>1$). As indicated, the magnitude value of both $F_{FFTk}$ and $F_{CZk}$ (not shown) at each k-location sample point on the circumference of these circles (in the plane of the paper) would be represented by the value of the z coordinate (perpendicular to the plane of the paper) at each of these respective k-location sample points. At any point in the complex plane in which the denominator of equation 1 or 2 approaches a value of zero, a pole (such as $P_1$, $P_2$, $P_3$ or $P_4$) is generated in which the local magnitude value of both $F_{FFTk}$ and $F_{CZk}$ rises toward a peak value of infinity. As indicated in FIG. 2, a pole, such as $p_1$, situated within inside circle 202 is inherently compatible with a stable IIR filter, while a pole, such as $p_3$, situated within the inner annulus (i.e., still within unit circle 200) is marginally compatible with a stable IIR filter. However, poles (such as $p_2$ and $p_4$) which are situated outside of unit circle 200 are indicative of an unstable IIR filter. The present invention utilizes these relationships to first identify those poles which cause filter instability, and then provides means for eliminating such poles. In this manner, a stable IIR deghosting filter, in which the sum of the magnitudes of the time-domain coefficients of the filter is greater than unity, can be achieved.

A first set of frequency-domain oversampled sample points k may be established at given equidistant phase angles around the entire circumference of inside circle 202; a second set of frequency-domain oversampled sample points k may be established at the same given equidistant phase angles around the entire circumference of unit circle 200; and a third set of frequency-domain oversampled sample points k may be established at the same given equidistant phase angles around the entire circumference of outside circle 204.

The gradient of the three magnitude values of chirp-z transforms of the sample points at the same phase angle of all three circles are related to one another in one of the following six different ways:

| $Fcz_k$ circle 202 | $Fcz_k$ circle 200 | $Fcz_k$ circle 204 |
|---|---|---|
| 1. largest value | middle value | smallest value |
| 2. smallest value | middle value | largest value |
| 3. largest value | smallest value | middle value |
| 4. smallest value | largest value | middle value |
| 5. middle value | largest value | smallest value |
| 6. middle value | smallest value | largest value |

Relationship 1 is indicative of a stable pole $p_1$ situated within inside circle 202, relationship 2 is indicative of an unstable pole $p_2$ situated beyond outside circle 204; while relationships 3-6 are indicative of a pole, such as $p_3$ or $p_4$, situated within an inner or outer annulus, with relationship 6 being indicative of an unstable pole $p_4$ and any of relationships 3, 4 and 5 being indicative of a marginally stable pole $p_3$. By determining the chirp-z transform magnitude values for all of the frequency-domain sample points k of the aforesaid three sets, and applying the aforesaid six gradient relationships to each sample-point phase angle thereof, phase angles which are in the localized region of an unstable pole can be determined. Further, by linearly interpolating values at each of the oversampled sample points between the chirp-z transform magnitude values on one side and the other side of an unstable pole within such a localized region of the frequency-domain plane, while maintaining the same vector magnitudes in the frequency-domain plane, the peak chirp-z transform magnitude values within this localized region are flattened, thereby eliminating that unstable pole. More specifically, for an m times oversampled spectrum the interpolation takes place between $+/-$ m sample points in the frequency domain which is closest to the unstable pole to be eliminated. An inverse transform is then computed to create new time-domain coefficients $x_n$. This inverse transform need be computed only over the phase-altered samples in the frequency domain. Unfortunately, modifying the frequency response and performing inverse transforms causes the sparseness of the deghoster filter shown in FIG. 1 to be reduced, since the frequency-domain modifications contribute to all of the 256 or 512 coefficients $x_n$ of the filter, regardless of whether they were originally zero or non-zero coefficients. However, experiment has shown that, in most cases, a stable deghosting IIR filter can be achieved by the inverse-transform computation of new time-domain coefficients at the locations of the original non-zero coefficients. In the case of grossly unstable filters, the above-described process may need to be repeated one or more times. Further, it has been found that these frequency-domain modifications to obtain filter stability contribute little apparent damage to the ghost-cancelling characteristics of the filter.

Figure 3A:
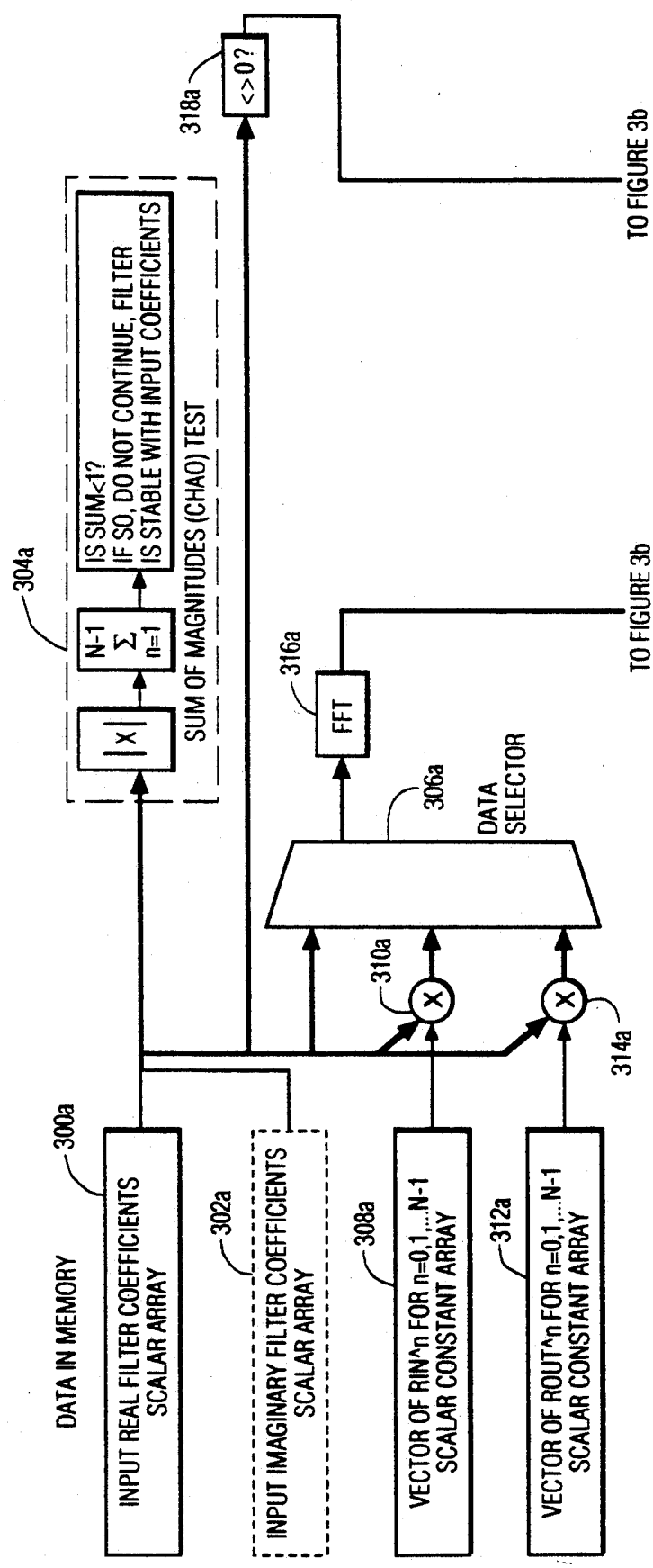
FIGS. 3a, 3b and 3c, taken together, comprise a flow chart showing the procedure employed by the present invention to test for, and then repair, instability in an IIR filter of the type shown in FIG. 1.
Figure 3B:
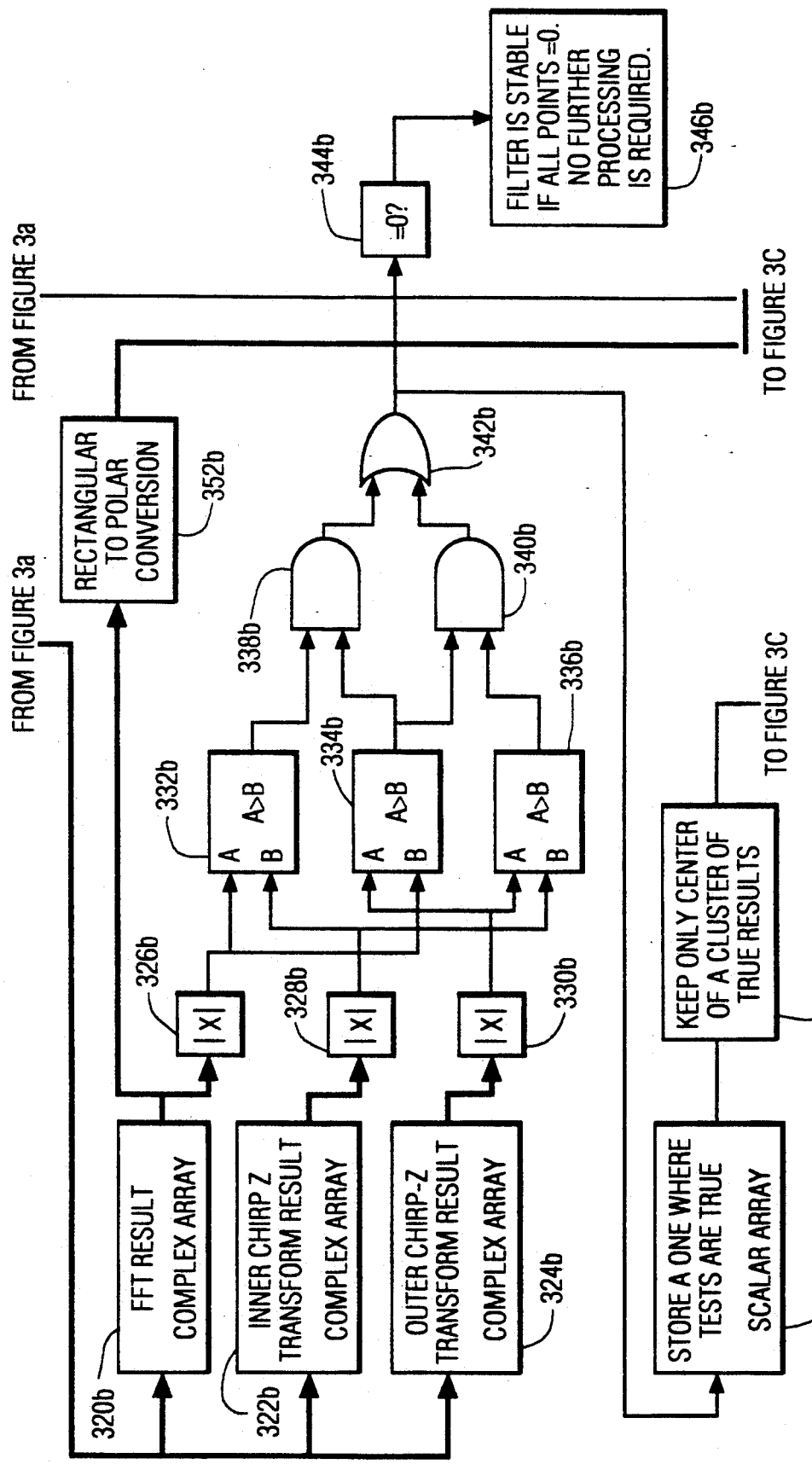
Figure 3C:
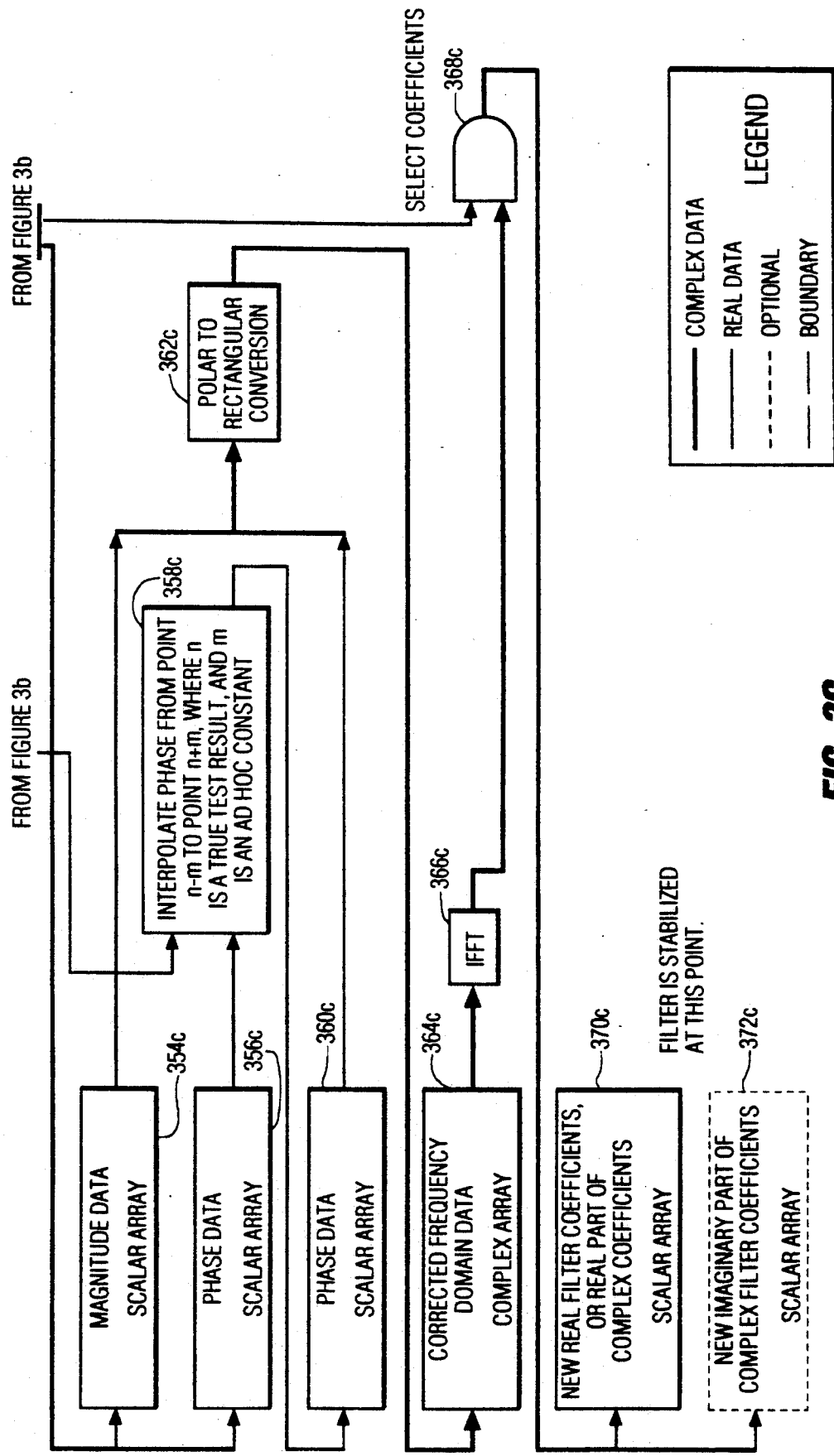

FIGS. 3a, 3b and 3c, taken together, show a flow chart of a system, which employs the approach described above in connection with FIG. 2, to test whether or not an IIR digital filter, such as the IIR deghosting filter shown in FIG. 1, is stable and, if not, modifying the coefficients thereof to render it stable.

As indicated by the legend (FIG. 3c), complex data is indicated by a thick solid line, real data is indicated by a thin solid line, optional (i.e., imaginary) data is indicated by a dotted line, and boundary data is indicated by a dashed line. While, in practice, the data may be solely real or complex, it is assumed for purposes of description that all data is complex. In this case, the system starts with data in memory which includes a scalar array of input real filter coefficients 300a and a scalar array of input imaginary filter coefficients 302a (FIG. 3a), which are combined to provide complex input filter coefficients $x_n$ in the time domain. Throughout the drawing, the symbol $|x|$ in a square box is employed to designate the magnitude of a complex quantity, such as a complex input filter coefficient, wherein $|x|$ is equal to the absolute value of the square root of the sum of the squares of the real and imaginary components of the complex quantity. As a boundary condition, Chao test 304a is performed on the complex input filter coefficients. If Chao test 304a is passed, the IIR filter is stable and no further testing is required.

If Chao test 304a is failed, the complex input filter coefficients are: (1) for unit circle 200, applied directly to a first input of data selector 306a, (2) after being multiplied by a scalar constant array of $r^n$ vectors 308a for inside circle 202 (shown as $rin^n$ in the drawing) by multiplier 310a, applied to a second input of data selector 306a, and (3) after being multiplied by a scalar constant array of $r^n$ vectors 312a for outside circle 204 (shown as $rout^n$ in the drawing) by multiplier 314a, applied to a third input of data selector 306a. Each selected output from data selector 306a is applied, in turn, as an input to FFT means 316a. The result is the sequential generation at the output of FFT means 316a of the chirp-z transforms for all the k sample points in the frequency domain of the aforesaid second set for unit circle 200 (where the chirp-z transform $F_{CZk}$ of equation 2 is equal to the FFT transform $F_{FFTk}$ of equation 1), the aforesaid first set of inside circle 202, and the aforesaid third set for outside circle 200. The complex output from FFT means 316a is forwarded to FIG. 3b. Further, the output from means 318a, which determines whether or not the complex value of any of the coefficients $x_n$ is zero, is forwarded through FIG. 3b to FIG. 3c, and will be discussed below in connection with FIG. 3c.

Referring now to FIG. 3b, the three results sequentially generated at the output of FFT means 316a (described above), and forwarded thereto from FIG. 3a, are respectively stored in complex arrays 320b, 322b and 324b. The stored complex values of the three results at each successive sample point k are concurrently read out from complex arrays 320b, 322b and 324b, and the magnitudes of each of these stored complex values, after being computed by means 326b, 328b and 330b, are applied as inputs to logic means comprising comparators 332b, 334b and 336b, AND gates 338b and 340b, and OR gate 342b. The logic output of this logic means (appearing at the output of OR gate 342b) is a "1" only in those cases, if any, in which above-described relationship 2 or 6 exists (indicative of the presence of an unstable pole in the frequency-domain complex plane), and is otherwise a "0".

Means 344b is initially set to a 0 state, and is switched to a "1" state in response to a "1" logic output from OR gate 342b. Therefore, if means 344b still remains in its "0" state after the respective magnitudes of all the stored complex-value results in complex arrays 320b, 322b and 324b have been tested by the logic means, no unstable pole is indicated and, therefore, the filter is stable. Thus, in this case, no further processing is required, as set forth in block 346b.

Means 348 stores each occurrence of a "1" logic output from OR gate 342b, applied as an input thereto, at a location corresponding to the ordinal value of the sequentially readout output from complex arrays 320b, 322b and 324b, forwarded through means 326b, 328b and 330b as an input to the logic means, which gave rise to that occurrence. Means 350b computes the location of the center of a cluster of stored logic "1"'s in means 348b, using known techniques (e.g. center-of-gravity or least-square-error, by way of examples). Further, the output from solely complex array 320b (corresponding to unit circle 200) is converted from rectangular to polar coordinates by means 352b, and the output of means 352b, along with the output of means 350b, are forwarded to FIG. 3c.

From the foregoing description, it is apparent that if the filter is stable with its original set of zero-valued and non-zero-valued coefficients, this fact will have been established either by its passing the Chao test of FIG. 3a or its passing the logic test of means 344b of FIG. 3b. However, if the filler has failed both of these tests, and, therefore, has been found to be unstable, it needs to be repaired (in a manner such as that shown in FIG. 3c) in order to be made stable.

Referring now to FIG. 3c, the magnitude and phase components of all the complex polar-coordinate sample data at the output of means 352b, in FIG. 3b, are forwarded to FIG. 3c and stored, respectively, as a scalar array of magnitude-data in means 354c and as a scalar array of phase-data in means 356c, while the output of means 350b, in FIG. 3b (indicative of the location of the center of each local region in the frequency-domain which requires its phase values to be flattened in order to eliminate an unstable pole) is forwarded as a control input to means 358c. All the phase data stored in means 356c is sequentially read out therefrom and applied as a signal input to means 358c. Means 358c, in response to the two readout phase values within a local region which are, respectively, m sample points below and m sample points above the center of that local region (and, therefore, correspond to chirp-z transform magnitude values that are significantly smaller than the peak chirp-z transform magnitude value of that local region, which chirp-z transform magnitude value is indicative of an unstable pole), linearly interpolates phase values between these two readout phase values. Means 358c then substitutes these interpolated phase values for those corresponding original sample-point phase values applied as part of the signal input thereto. The phase sample-points at the output of means 358c, which includes both the substituted interpolated phase values of all localized regions which had been found in FIG. 3b to be indicative of an unstable pole and the original phase values input thereto which are not part of any localized region that is indicative of an unstable pole, are stored as a phase-data scalar array in means 360c.

The magnitude data from means 354c and the phase data from means 360c are read out, converted from polar coordinates back to rectangular coordinates by means 362c, and stored as a complex array of frequency-domain data in means 364c. Because the chirp-z and FFT transforms are identical for a frequency-domain unit circle, readout frequency-domain data from means 364c can be transformed back to a new set of complex coefficients in the time domain by inverse FFT (IFFT) means 366c. This new set will likely contain non-zero valued complex coefficients in the time domain at those particular filter taps at which the original set contained non-zero valued coefficients. However, because the above-described repair of filter instability changed phase values only in the local regions of unstable poles in the frequency domain, and did not change any magnitude values in the frequency domain at all, the magnitude of the new set non-zero valued complex coefficients in the time domain at those particular filter taps would normally be sufficiently small to permit them to be ignored without affecting filter stability. Therefore, the zero-valued and non-zero-valued complex coefficients of the new set in the time domain, all of which are applied from the output of IFFT 366c as an input to gate 368c, are restricted at the output of gate 368c to the zero-valued and non-zero-valued complex coefficients of the original set in accordance with the binary value of a control input to gate 368c that has been forwarded thereto, through FIG. 3b, from means 318a of FIG. 3a. A scalar array of the real components of the restricted complex coefficients of the new set in the time domain are stored in means 370c and a scalar array of the imaginary components of the restricted complex coefficients of the new set in the time domain are stored in means 372c.

In order to ascertain whether the new coefficient components stored in means 370c and 372c do, in fact, provide a stable deghosting IIR filter, it is desirable to provide a second test with these new coefficients employing the teachings described above in connection with FIGS. 3a and 3b. If the new coefficients should fail this second test, a second attempt to repair filter instability may be made employing the teachings described above in connection with FIG. 3c. However, should the filter have too many unstable poles, the above-described teachings will not be able to provide stable coefficients without significantly changing the intended response of the filter. Therefore, only a limited number of attempts to repair filter instability is feasible.

The teachings of the present invention are not confined to those of the preferred embodiment, wherein the magnitude gradient of chirp-z sample points in the frequency-domain complex plane on a unit circle, a circle inside the unit circle and a circle outside the unit circle are employed. For instance, magnitude gradients may be used of chirp-z transform sample points situated whenever desired in the frequency-domain complex plane on a group of arcs, on a spiral or on other selected geometric shapes to indicate the location of a pole, whether stable or unstable. Further, a particular region of the frequency-domain complex plane situated outside of the unit circle which contains an unstable pole may be localized to any desired degree by employing magnitude gradients of chirp-z transform sample points situated on selected geometric shapes.

What is claimed is:

1. In a system incorporating an infinite-impulse-response (IIR) digital transversal filter including a delay having N taps, where N is a given plural integer and particular non-zero valued multiplier coefficients are associated with only certain ones of said N taps and zero-valued coefficients are associated with remaining ones of said taps; apparatus for determining whether or not said IIR filter is stable when the sum of the magnitudes of said multiplier-coefficient values in the time domain is greater than unity; said apparatus comprising:

data selector means for arranging said multiplier coefficients in the complex in-phase (I), quadrature (Q) frequency domain plane so as to exhibit gradients of magnitude therebetween at a given phase;

transform means coupled to said data selector means for providing chirp-z transformed multiplier coefficient values including transformed values within selected localized regions of said complex frequency domain plane, said transformed values within localized regions exhibiting gradients of magnitude therebetween at a given phase; and analysis means responsive to said gradients for determining a location of an unstable pole at a localized region in said frequency domain plane.

2. The system defined in claim 1, further comprising apparatus for stabilizing an unstable filter indicated by said determination of an unstable pole by said analysis means, said stabilizing apparatus including:

second means responsive to an output from said analysis means for substituting interpolated values for chirp-z transform values within that selected localized region of the frequency-domain plane which has been determined to be associated with an unstable pole in said frequency-domain plane, thereby to flatten the phase response within that selected localized region; and third means employing inverse chirp-z transforms of said substituted interpolated values within that selected localized region of the frequency-domain plane thereby to modify said multiplier-coefficient values in the time domain;

whereby said IIR filter may be rendered stable with modified multiplier-coefficient values in the time domain that have a sum of the magnitudes of said modified multiplier-coefficient values greater than unity.

3. The system defined in claim 2, wherein:
said third means includes fourth means for restricting said modified multiplier-coefficient values in the time domain to only those certain ones of said N taps originally associated with non-zero valued multiplier coefficients.

4. The system defined in claim 2, wherein:
said multiplier-coefficient values in the time domain are complex multiplier-coefficient values.

5. The system defined in claim 2, wherein:
said filter comprises a deghosting filter of a digital television receiver in which said certain ones of said N taps of said delay line are selectable and said multiplier-coefficient non-zero values in the time domain are programmable.

6. The system defined in claim 5, wherein:
the number of taps N of said delay line is between 256 and 512; and
the number of said certain ones of said N taps of said delay line is between 25 and 127.

7. The system defined in claim 5, wherein:
each of said selected localized regions comprises (1) sample points on a unit circle in said frequency-domain plane, (2) sample points on a circle inside said unit circle in said frequency-domain plane, and (3) sample points on a circle outside said unit circle in said frequency-domain plane.

8. The system defined in claim 1, wherein:
said multiplier-coefficient values in the time domain are complex multiplier-coefficient values.

9. The system defined in claim 1, wherein:
said filter comprises a deghosting filter of a digital television receiver in which said certain ones of said N taps of said delay line are selectable and said multiplier-coefficient non-zero values in the time domain are programmable.

10. The system defined in claim 9, wherein:
the number of taps N of said delay line is between 256 and 512; and
the number of said certain ones of said N taps of said delay line is between 25 and 127.

11. The system defined in claim 9, wherein:
each of said selected localized regions comprises (1) sample points on a unit circle in said frequency-domain plane, (2) sample points on a circle inside said unit circle in said frequency-domain plane, and (3) sample points on a circle outside said unit circle in said frequency-domain plane.

* * * * *